United States Patent
Wu et al.

(10) Patent No.: US 9,239,891 B2
(45) Date of Patent: Jan. 19, 2016

(54) SYSTEM AND METHOD FOR DETERMINING A MATED SURFACE OF AN OBJECT HAVING A PLURALITY OF MEMBERS

(71) Applicants: Wen-Jun Wu, Novi, MI (US); Brian W Kao, Farmington Hills, MI (US); Bo Robert Zhou, Bloomfield Hills, MI (US); John R Borth, Clarkston, MI (US)

(72) Inventors: Wen-Jun Wu, Novi, MI (US); Brian W Kao, Farmington Hills, MI (US); Bo Robert Zhou, Bloomfield Hills, MI (US); John R Borth, Clarkston, MI (US)

(73) Assignee: FCA US LLC, Auburn Hills, MI (US)

( * ) Notice: Subject to any disclaimer, the term of this patent is extended or adjusted under 35 U.S.C. 154(b) by 261 days.

(21) Appl. No.: 13/901,116

(22) Filed: May 23, 2013

(65) Prior Publication Data
US 2014/0347356 A1   Nov. 27, 2014

(51) Int. Cl.
*G06F 17/50*   (2006.01)
*G06T 17/10*   (2006.01)
*G06T 17/20*   (2006.01)

(52) U.S. Cl.
CPC ............... *G06F 17/50* (2013.01); *G06T 17/10* (2013.01); *G06T 17/205* (2013.01)

(58) Field of Classification Search
CPC ......... G06T 17/20; G06T 17/00; G06T 17/10; G06F 17/175; G06F 17/50
See application file for complete search history.

(56) References Cited

U.S. PATENT DOCUMENTS

| | | | |
|---|---|---|---|
| 5,689,577 A | 11/1997 | Arata | |
| 6,501,471 B1 | 12/2002 | Venkataraman et al. | |
| 6,647,306 B2 | 11/2003 | Wu et al. | |
| 6,674,430 B1 | 1/2004 | Kaufman et al. | |
| 6,968,299 B1 | 11/2005 | Bernardini et al. | |
| 7,173,615 B2 | 2/2007 | Hux | |
| 7,299,684 B2 | 11/2007 | Wu et al. | |
| 8,368,714 B2 | 2/2013 | Chang et al. | |
| 2002/0151999 A1 | 10/2002 | Wu et al. | |
| 2004/0107080 A1* | 6/2004 | Deichmann et al. | 703/6 |
| 2004/0207622 A1* | 10/2004 | Deering et al. | 345/426 |
| 2005/0128195 A1 | 6/2005 | Houston et al. | |
| 2007/0097123 A1* | 5/2007 | Loop et al. | 345/442 |
| 2008/0297507 A1 | 12/2008 | Chen et al. | |
| 2012/0280993 A1 | 11/2012 | Jakobsen et al. | |
| 2013/0176311 A1 | 7/2013 | Wu | |
| 2013/0177234 A1 | 7/2013 | Wu | |

OTHER PUBLICATIONS

Pilz et al., Creation and Boundary Evaluation of CSG-Models, Engineering with Computers 5, pp. 105-118, 1989.*
TenMarks, Surface Area of Composite Figures (Prisms), https://www.youtube.com/watch?t=10&v=7251db2gp6Y, Uploaded on Mar. 24, 2010, accessed on Apr. 5, 2015.*

* cited by examiner

*Primary Examiner* — Haixia Du
(74) *Attorney, Agent, or Firm* — Ralph E. Smith

(57) ABSTRACT

A method for determining a mated portion of an object can include receiving design data defining a three-dimensional object having a first member mated with a second member. Each member can be represented by a plurality of triangles. The method can include determining an outer layer of the three-dimensional object and a mated surface of the three-dimensional object. The mated surface may be determined by utilizing a recursive process to analyze each specific triangle of the plurality of triangles. The recursive process can classify a triangle as: (i) on the outer layer when all of its vertices are on the outer layer, and (ii) in the mated surface when none of its vertices are on the outer layer. When a triangle has at least one but not all of its vertices on the outer layer, the triangle can be subdivided into sub-triangles, which are then analyzed individually.

18 Claims, 8 Drawing Sheets

SYSTEM AND METHOD FOR DETERMINING A MATED SURFACE OF AN OBJECT HAVING A PLURALITY OF MEMBERS

FIELD

The present disclosure relates generally to computer aided design and, more particularly, to a method of determining the mated surface and surface area of an object that is represented by two or more members.

BACKGROUND

Computer aided design (CAD) is used in many different fields. For example, an object of manufacture may be represented in a CAD or similar computer program to assist with the design, manufacture and analysis of that object. In such programs, three-dimensional objects may be represented by millions or tens of millions of triangles, where each triangle can be represented by three vertices, each of which having three coordinate values. Complex objects may be represented by multiple objects or members in a mated arrangement. Each of the members of the object may be represented by a plurality of triangles, and the object can be defined by the combination of its members.

It may be desirable to determine a surface area of an outer layer of an object, for example, to estimate the amount of paint needed to coat the object. For a simple, one-member object, the surface area of the object may be determined based on the plurality of triangles (e.g., summing the area of the triangles). For multi-member objects, however, the sum of the area of the triangles of each of its members may result in an inaccurate estimate as such a determination fails to account for the area of the mated portions, which will not be on the outer layer of the object. Thus, there is a need for a more accurate method of determining the surface area of the outer layer of multi-member objects.

SUMMARY

In one form, a method is provided in accordance with the teachings of the present disclosure. The method can include receiving, at a computing device having one or more processors, design data defining a three-dimensional object having a first member mated with a second member. Each of the first and second members can be represented by a plurality of triangles, where each triangle is defined by three vertices. Further, the method can include determining, at the computing device, an outer layer of the three-dimensional object and a mated surface of the three-dimensional object. The mated surface can be comprised of portions of the first and second members not in the outer layer. The mated surface may be determined by utilizing a recursive process to analyze each specific triangle of the plurality of triangles.

The recursive process can include classifying the specific triangle as in the mated surface when none of its vertices are located on the outer layer. Additionally, the process can classify the specific triangle as in the outer layer when all three of its vertices are located on the outer layer. The process can subdivide the specific triangle into a plurality of sub-triangles when at least one, but less than three, of its vertices are located on the outer layer, where each of the plurality of sub-triangles can then be included in the plurality of triangles to be analyzed.

In another form, another method is provided in accordance with the teachings of the present disclosure. The method can include receiving, at a computing device having one or more processors, design data defining a three-dimensional object having a first member mated with a second member. Each of the first and second members can be represented by a plurality of triangles, where each triangle is defined by three vertices. Additionally, the design data can include an identification of an outer layer of the three-dimensional object. Further, the method can include determining, at the computing device, a mated surface of the three-dimensional object. The mated surface can be comprised of portions of the first and second members not in the outer layer. The mated surface may be determined by utilizing a recursive process to analyze each specific triangle of the plurality of triangles.

The recursive process can include classifying the specific triangle as in the mated surface when none of its vertices are located on the outer layer. Additionally, the process can classify the specific triangle as in the outer layer when all three of its vertices are located on the outer layer. The process can subdivide the specific triangle into a plurality of sub-triangles when at least one, but less than three, of its vertices are located on the outer layer and when the specific triangle is larger than a size threshold. Each of the plurality of sub-triangles can then be included in the plurality of triangles to be analyzed. Also, the process can include classifying a predetermined percentage of the specific triangle as in the mated surface when at least one, but less than three, of its vertices are located on the outer layer and when the specific triangle is smaller than the size threshold.

Further areas of applicability of the teachings of the present disclosure will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present disclosure are intended to be within the scope of the present disclosure.

DESCRIPTION

Figure 1:
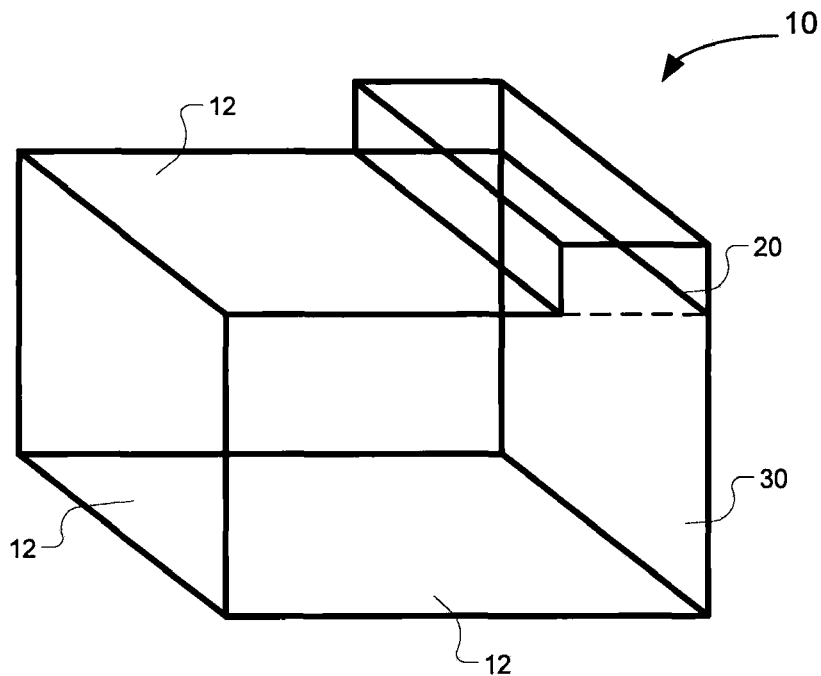
FIG. 1 is a perspective view of a three-dimensional object having a first member and a second member according to the principles of the present disclosure.

With initial reference to FIG. 1, an example three-dimensional object 10 having a first member 20 mated with a second member 30 is illustrated. It should be appreciated that, while the example object 10 is illustrated as having two members (the first and second members 20, 30), the present disclosure is applicable, mutatis mutandis, to objects having any number of members mated together. For the sake of simplicity, the description herein will be directed to the object 10 having the first and second members 20, 30.

The object 10 can include an outer layer or surface 12. The outer layer 12 can include those portions of the object 10 that are open or accessible to the outside of the object 10, and exclude those portions that are fully enclosed or mated together and are, therefore, not open or accessible to the outside of the object 10. For example only, if the object 10 was to be painted, the outer layer 12 would include those portions that would be coated with paint and exclude those portions that could not be painted (such as, the mated surfaces 24, 34 described below).

Figure 2A:
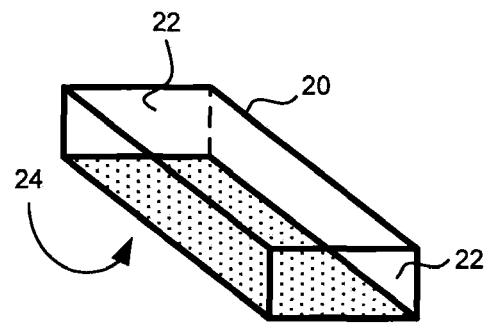
FIG. 2A is a perspective view of the first member of the three-dimensional object of FIG. 1 according to the principles of the present disclosure.
Figure 2B:
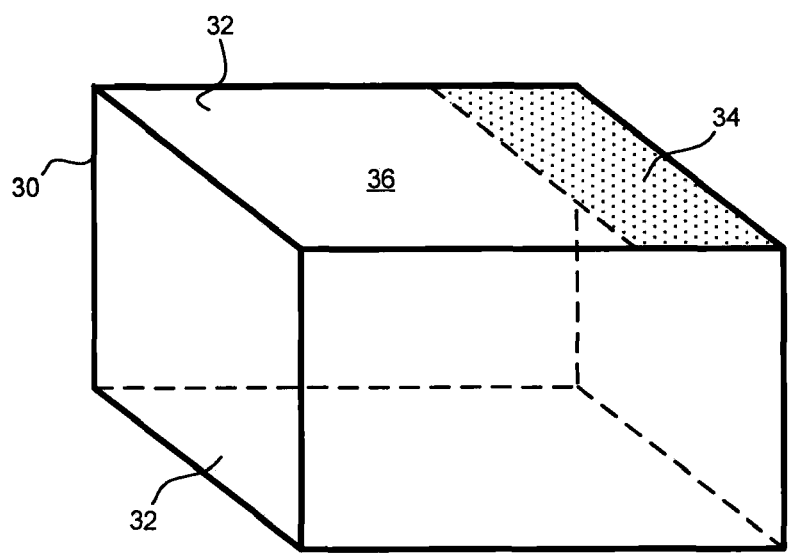
FIG. 2B is a perspective view of the second member of the three-dimensional object of FIG. 1 according to the principles of the present disclosure.

Referring now to FIGS. 2A and 2B, the first and second members 20, 30, respectively, of the object 10 are illustrated. The first member 20 can include an outer layer portion 22 and a mated portion 24. The outer layer portion 22 can include those portions of the first member 20 that are located on the outer layer 12 of object 10. The mated portion 24 can include those portions of the first object 20 that are not located on the outer layer 12 of the object 10. While the mated portion 24 illustrated in FIG. 2A is the portion of the first member 20 that is in contact with the second member 30, it should be appreciated that the mated portion 24 can also include a portion of the first member 20 that is not in contact with another member (e.g., second member 30). For example only, the mated portion 24 can include a pocket or hole (not shown) in the first member 20 that is fully surrounded or enclosed by one or more other members.

Similar to the first member 20 described above, the second member 30 shown in FIG. 2B can include an outer layer portion 32 and a mated portion 34. The outer layer portion 32 can include those portions of the second member 30 that are located on the outer layer 12 of the object 10, while the mated portion 34 can include those portions of the second object 30 that are not located on the outer layer 12 of the object 10. The mated portion 34 illustrated in FIG. 2B is the portion of the second member 30 that is in contact with the first member 20. It should be appreciated that the mated portion 34 can also include a portion of the second member 30 that is not in contact with another member, such as, a pocket or hole (not shown) in the second member 30 that is fully surrounded or enclosed by another member. As shown in FIG. 2B, an example surface 36 of the second member 30 can include both an outer layer portion 32 and a mated portion 34.

A representation of the object 10 can be generated by a computing device, such as through the execution of a computer-aided design program. The computing device can generate and/or receive (e.g., from a user, a network, and/or other computing device) design data for the object 10. Design data can include information sufficient to generate a visual representation of the object 10 for display. Furthermore, design data can include detailed information regarding the construction, manufacture, arrangement, and/or interaction of the object 10 and its constituent parts (e.g., first and second members 20, 30). In this manner, the design data can define the object 10 and its members (e.g., the first and second members 20, 30).

Figure 3:
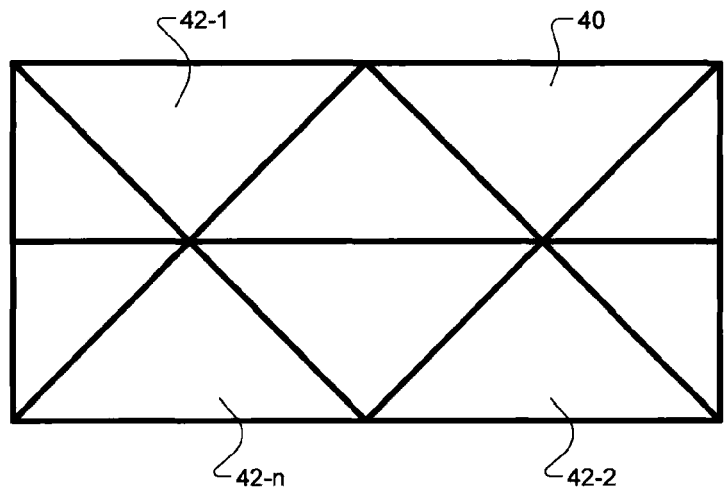
FIG. 3 is a schematic illustration of an example surface that is represented by a plurality of triangles according to the principles of the present disclosure.
Figure 4:
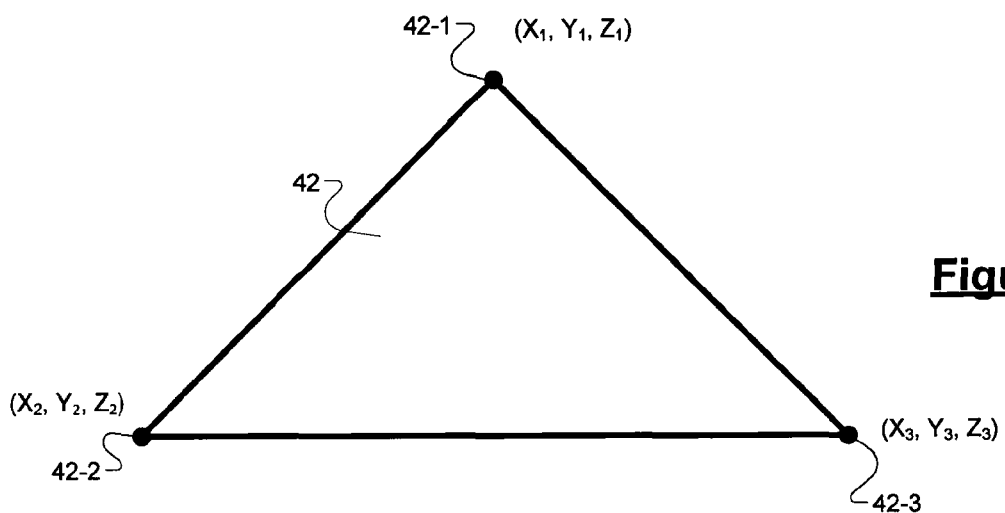
FIG. 4 is an illustration of an example triangle of the plurality of triangles of FIG. 3 according to the principles of the present disclosure.

Referring now to FIGS. 3 and 4, an example surface 40 of a computer representation of an object is shown. The surface 40 can be defined and represented by a plurality of triangles 42-1, 42-2 . . . 42-$n$ (herein referred to individually and collectively as "triangle(s) 42"), where n is an integer greater than 1. The example surface 40 can be any surface of the object 10 or the first and second members 20, 30. Accordingly, each of the first and second members 20, 30, and therefore object 10, can be represented by a plurality of triangles 42 arranged in a coordinate system. While the description herein is directed to the use of triangles 42 to represent the surface 40, other types of polygons (quadrilaterals, pentagons, etc.) could be used as an alternative with minor modifications of the described process. Additionally, the surface 40 is shown in two-dimensions for ease of illustration, but it should be appreciated that this disclosure is applicable to a surface arranged in three-dimensions.

Each triangle 42 can be defined by three vertices 44-1, 44-2 and 44-3 (herein referred to individually as "vertex 44" and collectively as "vertices 44"). Each vertex 44 can be defined as a specific point or coordinate in the coordinate system. For example, the vertex 44-1 can correspond to $(X_1, Y_1, Z_1)$, the vertex 44-2 can correspond to $(X_2, Y_2, Z_2)$, and the vertex 44-3 can correspond to $(X_3, Y_3, Z_3)$. Each coordinate $(X_1, X_2, X_3, \ldots)$ can be represented by a floating point decimal or similar variable type. In this manner, each of the members 20, 30, and therefore also the object 10, can be represented by a data structure that includes the coordinates for each of the vertices 44 of the plurality of triangles 40. The design data for object 10 can include the data structure for the vertices 44 and other information, as described more fully below.

Figure 5:
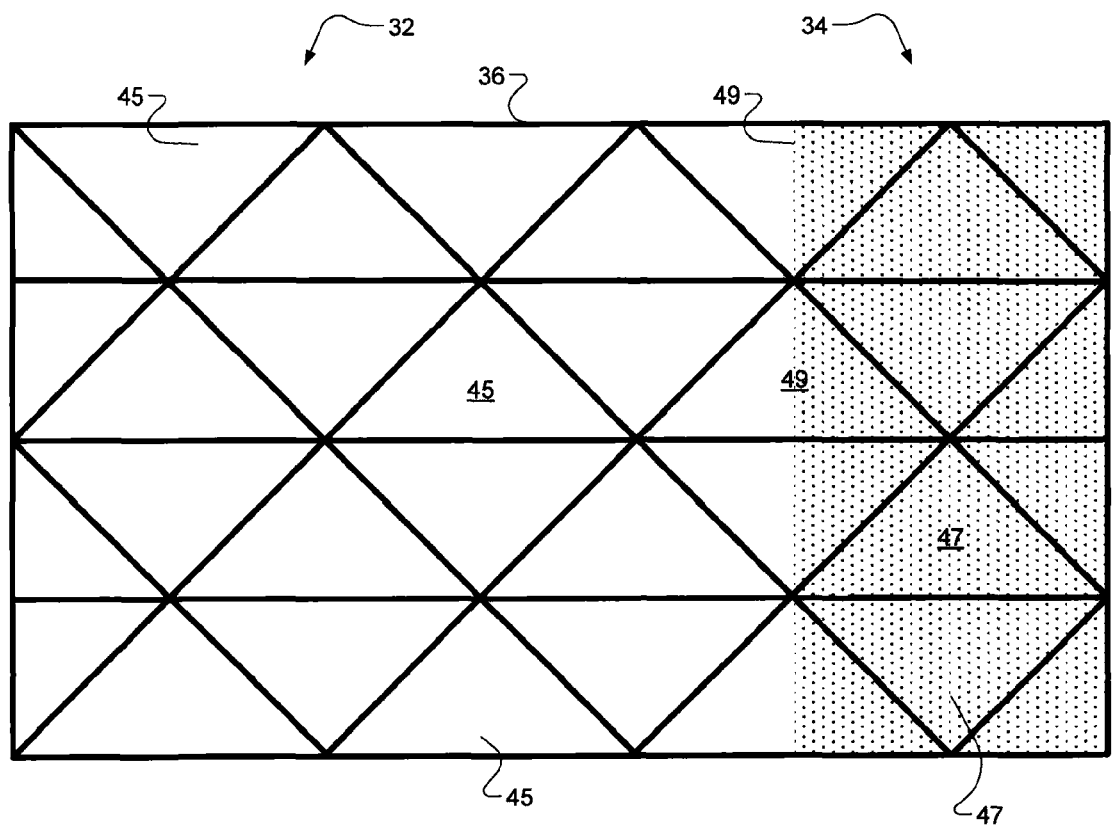
FIG. 5 is a schematic illustration of an example surface of the second member of the three-dimensional object of FIG. 1 showing an outer layer portion and a mated surface portion according to the principles of the present disclosure.

With specific reference to FIG. 5 and example surface 36, each of the triangles 42 that represent the surface 36 can be: (i) outer layer triangles 45 located completely in the outer layer portion 32 (and, therefore, outer layer 12 of object 10), (ii) mated portion triangles 47 located completely in the mated portion 34 (and, therefore, not in the outer layer 12), or (iii) unclassified triangles 49 partially within both the outer layer and mated portions 32, 34. As described more fully below, each specific triangle 42 can be analyzed in order to classify it as: (i) an outer layer triangle 45, (ii) a mated portion triangle 47, or (iii) an unclassified triangle 49.

In order to analyze and classify the triangles 42, an outer layer 12 of the object 10 can be determined, e.g., based on the design data. Various methods of determining the outer layer 12 of the object 10 are described in co-pending U.S. patent application Ser. No. 13/735,200, which claims priority to U.S. Provisional Patent Application Ser. No. 61/584,408, the disclosures of both of these applications being incorporated herein by reference in their entirety. Alternatively, in some embodiments, the determination of the outer layer 12 can be performed by receiving a representation of the outer layer 12, e.g., in the design data. The outer layer 12 can be represented by a data structure that specifies the coordinates of the outer layer 12 in the coordinate system. In this manner, the analysis and classification of the triangles 42 can be performed by comparing the vertices 44 of each specific triangle 42 with the coordinates of the outer layer 12.

A specific triangle 42 can be classified as an outer layer triangle 45 when all three of its vertices 44 are located on the outer layer 12 of the object 10. A specific triangle 42 can be classified as a mated portion triangle 47 when none of its vertices 44 are located on the outer layer 12. A triangle 42 can be an unclassified triangle 49 when at least one, but less than all three, of its vertices 44 are located on the outer layer 12. As described more fully below, the unclassified triangles 49 can be subdivided to form a plurality of sub-triangles, which can then be analyzed according to the classification process described above.

Figure 6:
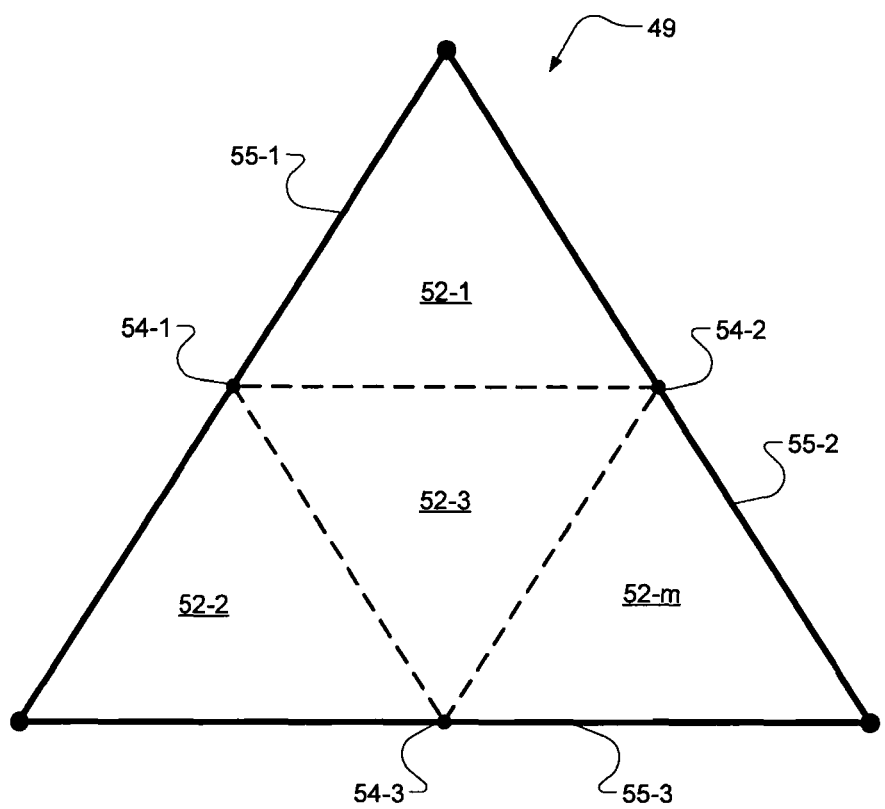
FIG. 6 is an illustration of an example specific triangle that has been subdivided into a plurality of sub-triangles according to the principles of the present disclosure.

Referring now to FIG. 6, an unclassified triangle 49 can be subdivided to form a plurality of sub-triangles 52-1, 52-2, . . . 52-m (herein referred to individually and collectively as "sub-triangle(s) 52"), where m is an integer greater than 1. In the illustrated example of FIG. 6, m is equal to four as there are four sub-triangles 52. In some embodiments, such as the example illustrated in FIG. 6, the unclassified triangle 49 can be subdivided by determining a midpoint 54-1, 54-2, 54-3 of each of the sides 55-1, 55-2, 55-3, respectively, of the triangle 49. The sub-triangles 52 may be defined such that one sub-triangle 52-3 has as its vertices the midpoints 54-1, 54-2, 54-3, and each of the other sub-triangles (52-1, 52-2, 52-m) has one of the vertices of the unclassified triangle 49 as one vertex, and two of the midpoints 54-1, 54-2, 54-3 as its other two vertices. Furthermore, the sub-triangles 52 can be defined such that they do not overlap.

Figure 7:
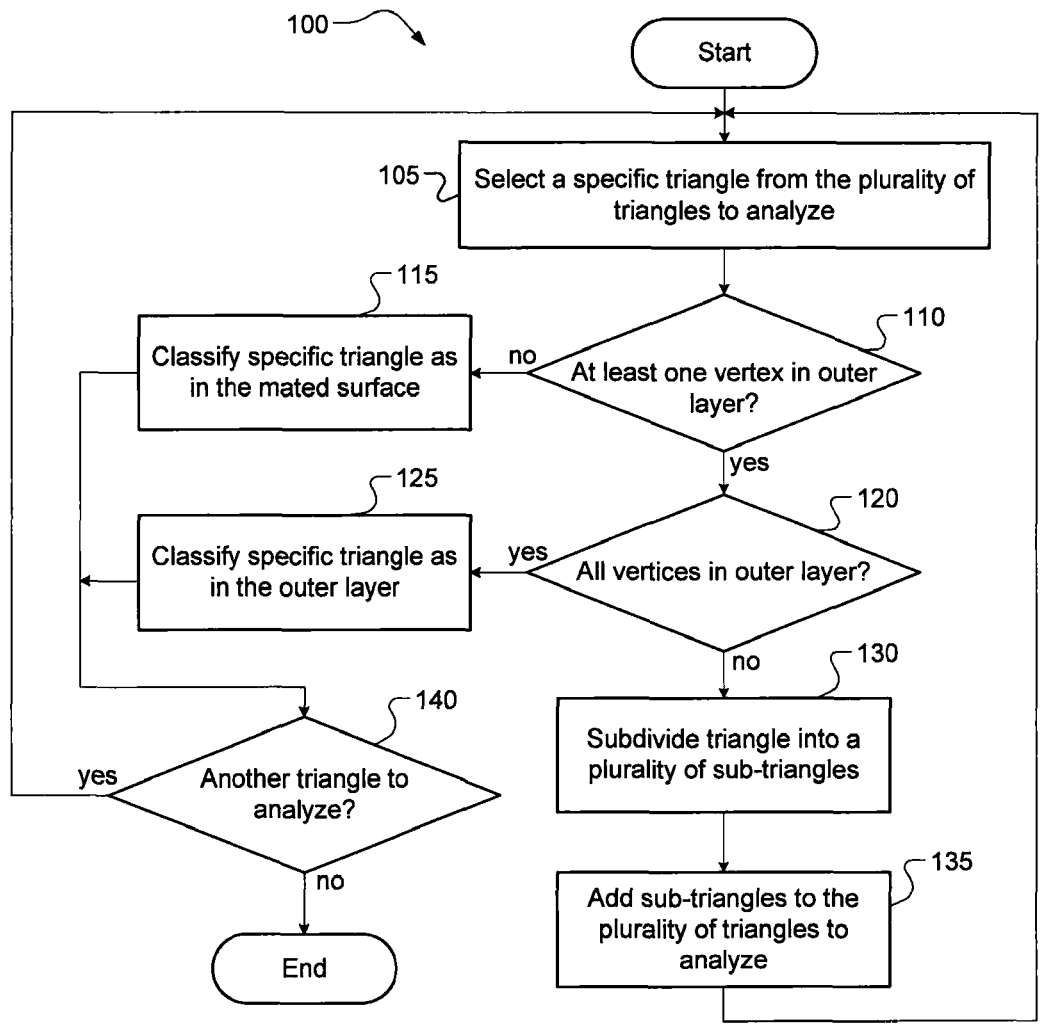
FIG. 7 is a flow diagram of a recursive process for determining the mated surface of an object according to the principles of the present disclosure.

An example recursive process 100 for determining the mated surface(s) 24, 34 of an object 10 is illustrated in FIG. 7. The process 100 can be utilized to analyze each specific triangle of the plurality of triangles 42. At 105, a specific triangle 42 is selected from the plurality of triangles 42. The specific triangle 42 is analyzed at 110 to determine whether at least one of its vertices 44 is located in the outer layer 12 of the object 10. When none of the vertices 44 of the specific triangle 42 is located on the outer layer 12, the specific triangle 42 is classified at 115 as a mated portion triangle 47 that is completely within the mated surfaces 24, 34. The process 100 then proceeds to 140 at which it is determined whether there are any specific triangles in the plurality of triangles 42 that remain to be analyzed. When there are additional triangles 42 to analyze, the process 100 returns to 105. If all of the triangles 42 have been analyzed, the process 100 ends.

When at least one of the vertices 44 of the specific triangle 42 is located on the outer layer 12, the process 100 proceeds to 120 to determine whether all of the vertices 44 are located on the outer layer 12. When all of its vertices 44 are located on the outer layer 12, the specific triangle 42 is classified at 125 as an outer layer triangle 45 that is completely within the outer layer 12 of object 10. The process 100 then proceeds to 140 at which it is determined whether there are any specific triangles in the plurality of triangles 42 that remain to be analyzed. When there are additional triangles 42 to analyze, the process 100 returns to 105. If all of the triangles 42 have been analyzed, the process 100 ends.

When at least one, but less than all three, of its vertices 44 are located on the outer layer 12 (as determined at 110 and 120), the specific triangle 42 can be defined as an unclassified triangle 49 and be subject to further analysis. At 130, the specific triangle 42 (i.e., unclassified triangle 49) is subdivided into a plurality of sub-triangles 52. The specific triangle 42 can be subdivided in any manner, e.g., in the manner described above in which four sub-triangles 52 are defined for the specific triangle 42. The plurality of sub-triangles 52 are included in the plurality of triangles 42 to be analyzed at 135 and the process 100 returns to 105. In this manner, the process 100 can analyze and classify each specific triangle 42 as being located on the outer layer 12 or in the mated portions 24, 34.

Figure 8:
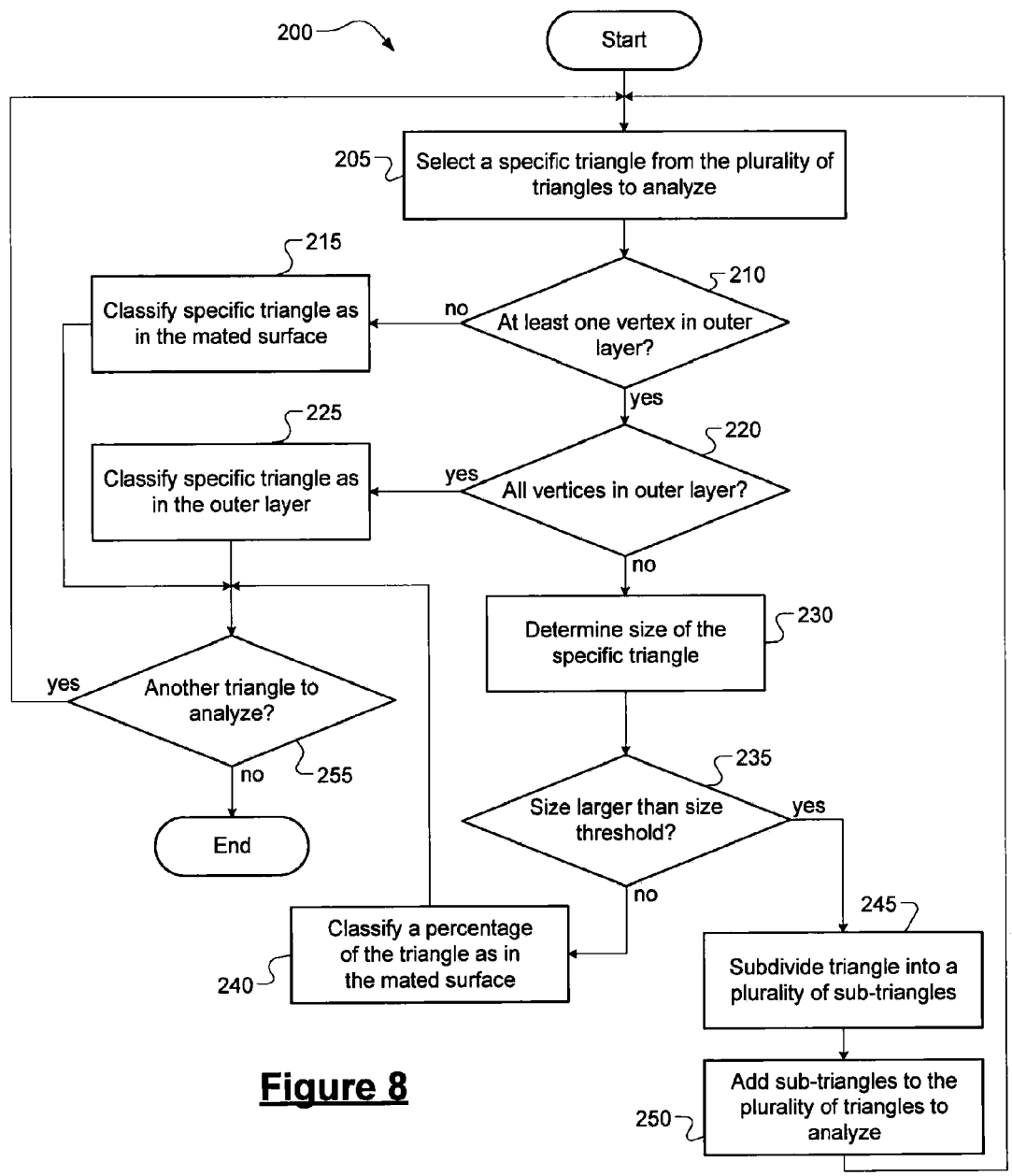
FIG. 8 is a flow diagram of another recursive process for determining the mated surface of an object according to the principles of the present disclosure.

With reference to FIG. 8, another example recursive process 200 for determining the mated surfaces 24, 34 of an object 10 is illustrated. Similar to the process 100 described above, the process 200 can be utilized to analyze each specific triangle of the plurality of triangles 42. At 205, a specific triangle 42 is selected from the plurality of triangles 42. At 210, the specific triangle 42 is analyzed to determine whether at least one of its vertices 44 is located in the outer layer 12 of the object 10. When none of the vertices 44 of the specific triangle 42 is located on the outer layer 12, the specific triangle 42 is classified at 215 as a mated portion triangle 47 that is completely within the mated surfaces 24, 34. The process 200 then proceeds to 255 at which it is determined whether there are any triangles 42 in the plurality of triangles 42 that remain to be analyzed. When there are additional triangles 42 to analyze, the process 200 returns to 205. If all of the triangles 42 have been analyzed, the process 200 ends.

When at least one of the vertices 44 of the specific triangle 42 is located on the outer layer 12, the process 200 proceeds at 220 to determine whether all of the vertices 44 are located on the outer layer 12. When all of its vertices 44 are located on the outer layer 12, the specific triangle 42 is classified at 225 as an outer layer triangle 45 (i.e., completely within the outer layer 12 of object 10). The process 200 then proceeds to 255 at which it is determined whether there are any triangles 42 in the plurality of triangles 42 that remain to be analyzed. When there are additional triangles 42 to analyze, the process 200 returns to 205. If all of the triangles 42 have been analyzed, the process 200 ends.

When at least one, but less than all three, of its vertices 44 are located on the outer layer 12 (as determined at 210 and 220), the specific triangle 42 can be defined as an unclassified triangle 49 and be subject to further analysis. A size of the specific triangle 42 can be determined at 230. The size of the specific triangle 42 can correspond to any type of size measurement, e.g., a length of one side of the triangle 42, an area of the triangle 42 or a total length of all of the sides of the triangle 42.

The size of the triangle 42 can be compared to a size threshold at 235. Similar to the size above, the size threshold can correspond to any type of size measurement, e.g., a specific length of one side of the triangle 42, an area of the triangle 42 or a total length of all of the sides of the triangle 42. In some embodiments, the size threshold corresponds to a triangle 42 having at least one side shorter than 0.1 millimeters. In another embodiment, the size threshold corresponds to a triangle 42 having all three sides shorter than 0.1 millimeters.

When the size of the triangle 42 is smaller than the size threshold, a predetermined percentage of the specific triangle 42 can be classified (at 240) as in the mated surface 24, 34. For example only, the predetermined percentage may be 50%. When the size of the specific triangle 42 is larger than the size threshold at 235, the process 200 can further analyze the specific triangle 42, as described more fully below. In the event that the size of the specific triangle 42 is equal to the size threshold, the process 200 is illustrated as classifying the specific triangle 42 as if it were smaller than the size threshold (that is, classifying a predetermined percentage of the specific triangle 42 as in the mated surfaces 24, 34 at 240). It should be appreciated, however, that a specific triangle 42 that has a size equal to the size threshold may alternatively be further analyzed as if the specific triangle 42 were larger than the size threshold.

When the size of the specific triangle 42 is larger than the size threshold at 235, the specific triangle 42 (i.e., unclassified triangle 49) is subdivided into a plurality of sub-triangles 52 at 245. The specific triangle 42 can be subdivided in any manner, e.g., in the manner described above in which four sub-triangles 52 are defined for the specific triangle 42. The plurality of sub-triangles 52 are included in the plurality of triangles 42 to be analyzed at 250 and the process 200 returns to 205. In this manner, the process 200 can analyze and classify each specific triangle 42 as being located on the outer layer 12 or in the mated portions 24, 34.

It may be desirable to determine a surface area of the outer layer 12 of the object 10. For example only, if the object 10 is a vehicle component (e.g., a hood, fender, or other body component), the surface area of the outer layer 12 may be utilized to calculate the amount of paint or other coating needed to cover the object 10. An estimation of the surface area can be determined by summing the individual surface areas for each of the members (first and second member 20, 30) of the object 10 to obtain a combined surface area. The surface area of each of the members 20, 30 can be determined based on the plurality of triangles 42 for each member. In some embodiments, the design data may include data indicative of the surface area of each of the members 20, 30 of the object 10. The combined surface area, however, may overestimate the actual surface area of the outer layer 12 of the object 10 as it fails to account for the mated portions 24, 34.

Figure 9:
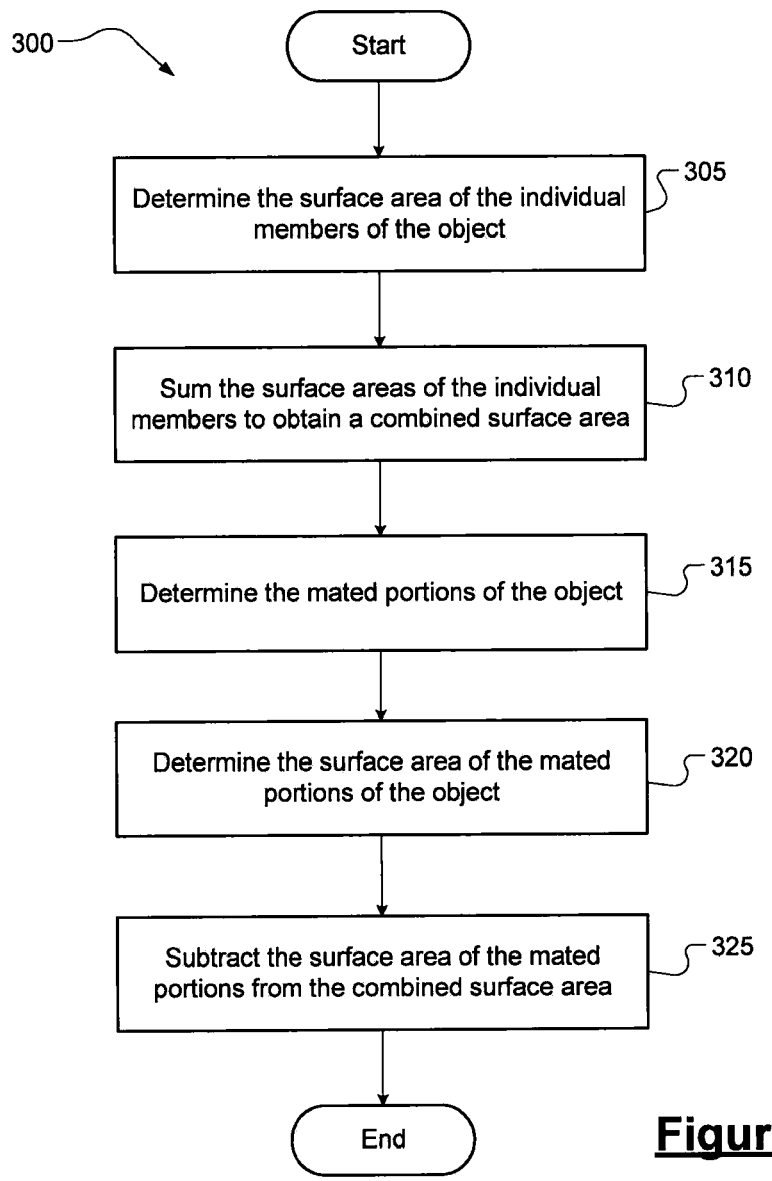
FIG. 9 is a flow diagram of a method for determining the surface area of an outer layer of an object according to the principles of the present disclosure.

Referring to FIG. 9, an example method 300 of determining the surface area of an outer layer 12 of an object 10 (such as the painted surface area) is illustrated. At 305, the surface areas of the individual members (such as first and second members 20, 30) of the object 10 are determined. As described above, the surface area of a member can be determined based on the plurality of triangles 42 for that member. In some embodiments, the design data may include the surface area of each of the members 20, 30 of the object 10.

The surface areas of each of the members 20, 30 are summed together to obtain a combined surface area at 310. At 315, the mated portions 24, 34 of the object 10 can be determined, e.g., by the processes 100, 200 described above. As a result of the processes 100, 200, the mated portions 24, 34 can be represented by the mated portion triangles 47 and the predetermined percentage of the triangles 49 that are below the size threshold, if any. Accordingly, the surface area of the mated portions 24, 34 can be determined at 320, e.g., based on the sum of the surface area for each of the mated portion triangles 47 and the predetermined percentage of any triangles 49 that are below the size threshold. Finally, an estimation of the surface area of the outer layer 12 can be determined by subtracting the surface area of the mated portions 24, 34 from the combined surface area at 325.

Figure 10:
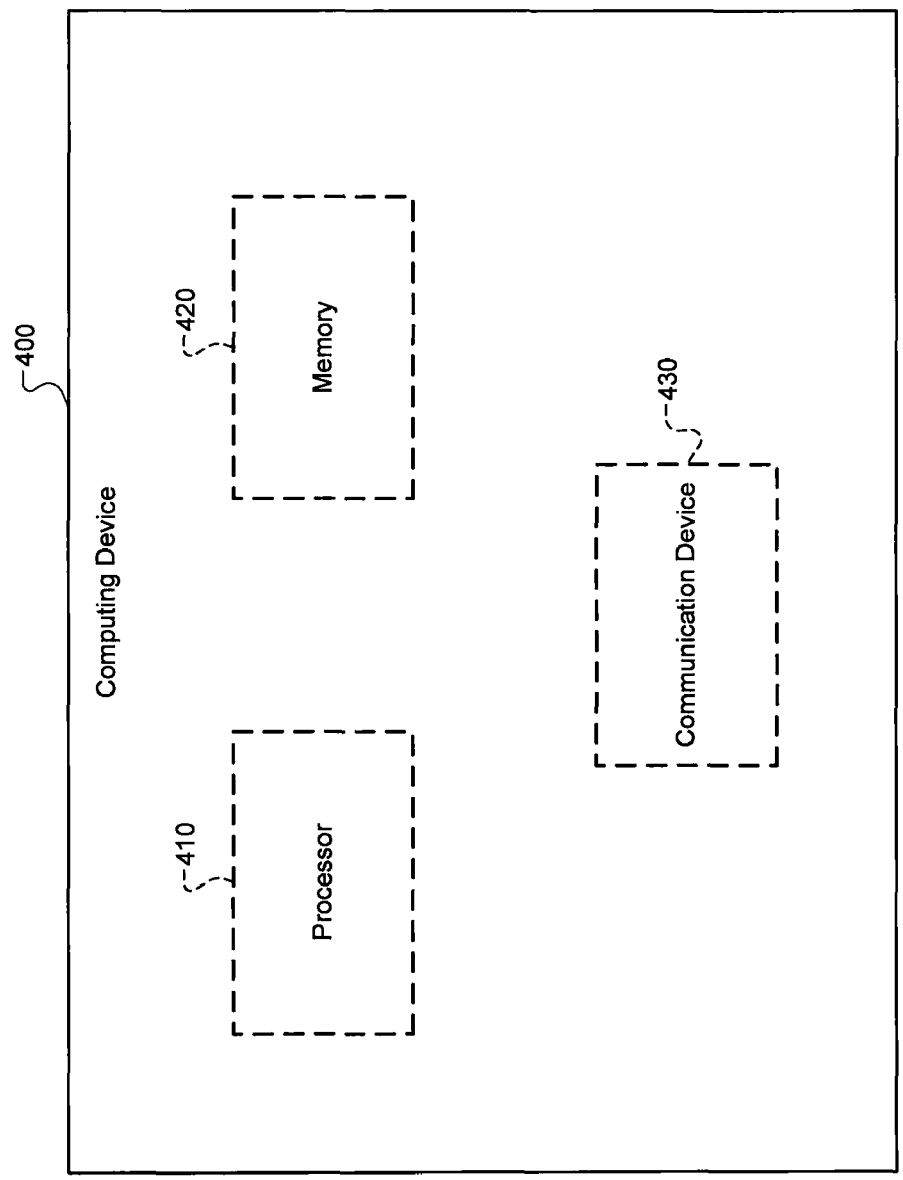
FIG. 10 is a functional block diagram of an example computing device configured to execute the processes and methods of determining the mated surface and surface area of an object according to the principles of the present disclosure.

With reference to FIG. 10, an example computing device 400 that is configured to determine a mated surface of an object having a plurality of members is illustrated. Examples of the computing device 400 include, but are not limited to, a desktop computer, a laptop computer, a specially configured workstation computing device, and a server computer. The term "computing device 400" as used herein is specifically meant to include both a single computing device, as well as two or more computing devices operating in a parallel or distributed architecture.

The computing device 400 can include a processor 410, a memory 420 and a communication device 330. The term "processor 410" as used herein is specifically meant to include both a single processor, as well as two or more processors operating in a parallel or distributed architecture. The processor 410 can execute computer readable instructions, such as those stored on a tangible, non-transitory computer readable medium. Further, the processor 410 can control operation of the computing device 400. Specifically, the processor 410 can control functions including, but not limited to, loading/executing an operating system of the computing device 400, controlling communication between the computing device 400 and other computing devices and/or networks via the communication device 330, processing information from the received from a user or other computing device(s), and/or controlling read/write operations at the memory 420.

The memory 420 can be any suitable tangible, non-transitory computer readable storage medium (flash, hard disk, etc.) or collection of storage media. In some implementations, the memory 420 can be non-volatile memory (NVM). The memory 420 can store computer readable instructions that are executed by the processor 410, as well as other data, such as the design data described above. The communication device 330 can include any suitable communication components, e.g., a transceiver, which can be configured for communication with a network (not shown) or other computing devices.

The computing device 400 can be configured to perform the processes and methods for determining a mated surface of an object having a plurality of members described above. For example only, the computing device 400 can receive the design data defining the object 10 and individual members 20, 30, determine the outer layer 12 of the object 10, and determine the mated surface of the object 10, e.g., by utilizing the recursive processes 100, 200. Furthermore, the computing device 400 can determine the surface area of one or more of: (i) the outer layer 12 of the object 10, (ii) the members 20, 30, and (iii) the mated surface(s) 24, 34, e.g., by utilizing the method 300 described above.

It should be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A computer-implemented method, comprising:
receiving, at a computing device having one or more processors and being specially configured to execute a computer-aided design program, computer-aided design data defining a three-dimensional object having a first member mated with a second member, each of the first and second members being represented by a plurality of triangles, each triangle being defined by three vertices;
determining, at the computing device, an outer layer of the three-dimensional object;
determining, at the computing device, a mated surface of the three-dimensional object, the mated surface comprising portions of the first and second members not in the outer layer,
wherein determining the mated surface comprises utilizing a recursive process to analyze each specific triangle of the plurality of triangles, the recursive process including:
(i) classifying the specific triangle as in the mated surface when none of its vertices are located on the outer layer,
(ii) classifying the specific triangle as in the outer layer when all three of its vertices are located on the outer layer, and (iii) when at least one, but less than three, of its vertices are located on the outer layer:
  (a) determining a size of the specific triangle,
  (b) comparing the size of the specific triangle with a size threshold,
  (c) classifying a predetermined percentage of the specific triangle as in the mated surface when the specific triangle is smaller than the size threshold, and
  (d) subdividing the specific triangle into a plurality of sub-triangles, each of the plurality of sub-triangles being included in the plurality of triangles to be analyzed; and
modifying, at the computing device, the computer-aided design data to include data representing the determined mated surface.

2. The method of claim 1, further comprising determining, at the computing device, a surface area of the outer layer of the three-dimensional object by:
  determining surface areas of the first and second members based on the plurality of triangles;
  adding the surface areas of the first and second members to obtain a combined surface area;
  determining a surface area of the mated surfaces based on triangles classified as in the mated surface; and
  subtracting the surface area of the mated surface from the combined surface area.

3. The method of claim 1, wherein the plurality of sub-triangles comprises four sub-triangles.

4. The method of claim 3, wherein subdividing the specific triangle into four sub-triangles comprises:
  determining a mid-point of each side of the specific triangle, the specific triangle having a first vertex, a second vertex and a third vertex;
  selecting the mid-points as vertices of the four sub-triangles, the four sub-Triangles comprising a first, second, third and fourth sub-triangles; and
  defining the four sub-triangles such that: (i) the first sub-triangle has vertices of the mid-points, (ii) each of the second, third and fourth sub-triangles has one vertex of the first, second and third vertex and two vertices of the mid-points, and (iii) the sub-triangles do not overlap.

5. The method of claim 4, further comprising determining, at the computing device, a surface area of the outer layer of the three-dimensional object by:
  determining surface areas of the first and second members based on the plurality of triangles;
  adding the surface areas of the first and second members to obtain a combined surface area;
  determining a surface area of the mated surfaces based on triangles classified as in the mated surface; and
  subtracting the surface area of the mated surface from the combined surface area.

6. The method of claim 1, wherein the size threshold corresponds to a triangle having at least one side shorter than 0.1 millimeters.

7. The method of claim 1, wherein the size threshold corresponds to a triangle having each of its sides shorter than 0.1 millimeters.

8. The method of claim 1, wherein determining the outer layer of the three-dimensional object comprises receiving a representation of the outer layer of the three-dimensional object.

9. The method of claim 8, wherein the representation of the outer layer of the three-dimensional object is included in the design data.

10. The method of claim 1, wherein the mated surface includes portions of the first member contacting the second member and portions of the second member contacting the first member.

11. A computer-implemented method, comprising:
  receiving, at a computing device having one or more processors and being specially configured to execute a computer-aided design program, computer-aided design data defining a three-dimensional object having a first member mated with a second member, the first and second members being represented by a plurality of triangles, each triangle being defined by three vertices, the design data including an identification of an outer layer of the three-dimensional object;
  determining, at the computing device, a mated surface of the three-dimensional object, the mated surface comprising portions of the first and second members not in the outer layer of the three-dimensional object,
  wherein determining the mated surface comprises utilizing a recursive process to analyze each specific triangle of the plurality of triangles, the recursive process including:
    (i) classifying the specific triangle as in the mated surface when none of its vertices are located on the outer layer,
    (ii) classifying the specific triangle as in the outer layer when all three of its vertices are located on the outer layer,
    (iii) subdividing the specific triangle into a plurality of sub-triangles when at least one, but less than three, of its vertices are located on the outer layer and when the specific triangle is larger than a size threshold, each of the plurality of sub-triangles being included in the plurality of triangles to be analyzed, and
    (iv) classifying a predetermined percentage of the specific triangle as in the mated surface when at least one, but less than three, of its vertices are located on the outer layer and when the specific triangle is smaller than the size threshold; and
  modifying, at the computing device, the computer-aided design data to include data representing the determined mated surface.

12. The method of claim 11, wherein the size threshold corresponds to a triangle having at least one side shorter than 0.1 millimeters.

13. The method of claim 11, wherein the plurality of sub-triangles comprises four sub-triangles.

14. The method of claim 13, wherein subdividing the specific triangle into four sub-triangles comprises:
  determining a mid-point of each side of the specific triangle, the specific triangle having a first vertex, a second vertex and a third vertex;
  selecting the mid-points as vertices of the four sub-triangles, the four sub-Triangles comprising a first, second, third and fourth sub-triangles; and
  defining the four sub-triangles such that: (i) the first sub-triangle has vertices of the mid-points, (ii) each of the second, third and fourth sub-triangles has one vertex of the first, second and third vertex and two vertices of the mid-points, and (iii) the sub-triangles do not overlap.

15. The method of claim 14, further comprising determining, at the computing device, a surface area of the outer layer of the three-dimensional object by:
  determining surface areas of the first and second members based on the plurality of triangles;
  adding the surface areas of the first and second members to obtain a combined surface area;

determining a surface area of the mated surfaces based on triangles classified as in the mated surface; and subtracting the surface area of the mated surface from the combined surface area.

16. The method of claim 11, wherein the mated surface includes portions of the first member contacting the second member and portions of the second member contacting the first member.

17. The method of claim 11, wherein the size threshold corresponds to a triangle having each of its sides shorter than 0.1 millimeters.

18. The method of claim 11, further comprising determining, at the computing device, a surface area of the outer layer of the three-dimensional object by:

determining surface areas of the first and second members based on the plurality of triangles;

adding the surface areas of the first and second members to obtain a combined surface area;

determining a surface area of the mated surfaces based on triangles classified as in the mated surface; and subtracting the surface area of the mated surface from the combined surface area.

* * * * *